United States Patent [19]
Tsai

[11] Patent Number: 4,755,485
[45] Date of Patent: Jul. 5, 1988

[54] METHOD OF MAKING LIGHT-EMITTING DIODES

[75] Inventor: Minq-Jonq Tsai, San Jose, Calif.

[73] Assignee: Hewlett-Packard Company, Palo Alto, Calif.

[21] Appl. No.: 98,258

[22] Filed: Sep. 18, 1987

Related U.S. Application Data

[60] Division of Ser. No. 868,161, May 27, 1986, Pat. No. 4,719,497, which is a continuation of Ser. No. 620,978, Jun. 15, 1985, abandoned.

[51] Int. Cl.$^4$ .......................................... H01L 21/383
[52] U.S. Cl. .................................... 437/126; 437/127; 437/128; 437/167; 437/905
[58] Field of Search ............... 437/128, 127, 126, 129, 437/167, 905; 372/45; 357/17

[56] References Cited

U.S. PATENT DOCUMENTS

| | | | |
|---|---|---|---|
| 3,783,351 | 1/1974 | Tsukada et al. | 437/129 X |
| 4,011,113 | 3/1977 | Thompson et al. | 437/129 |
| 4,183,038 | 1/1980 | Namizaki et al. | 437/129 X |
| 4,213,808 | 7/1980 | Thompson et al. | 437/129 |
| 4,280,858 | 7/1981 | VanOpdorp et al. | 437/150 X |
| 4,517,674 | 5/1985 | Liu et al. | 357/17 X |

Primary Examiner—George T. Ozaki

[57] ABSTRACT

A structure and method for use in optical communication systems is provided in which a metal is diffused in a heterojunction region beneath a metal contact of a AlGaAs light emitting diode. This structure and method significantly reduces the contacting shadowing problem due to current crowding beneath the contact thus increasing the light output from the device.

9 Claims, 1 Drawing Sheet

METHOD OF MAKING LIGHT-EMITTING DIODES

This application is a division of application Ser. No. 868,161, filed May 27, 1986, now U.S. Pat. No. 4,719,497, which is a continuation of application Ser. No. 620,978, filed June 15, 1984, now abandoned.

BACKGROUND

This invention relates to a method of an a structure for improving light efficiency through a double heterojunction in AlGaAs red light emitting diodes (LED's) by reducing contact shadowing due to current crowding beneath the contact area. These AlGaAs LED's are for use in, for example, optical fiber communication systems.

Presently, AlGaAs light emitting diodes which are characterized by a double heterojunction have low luminous efficiencies because of contact shadowing due to current crowding at the p-n junction of the diode under the contact area. As external contact is made to the structure through a metal contact attached to the heterojunction region, light is emitted along the p-active layer as holes from the p-active layer (p-region) and electrons injected from the n-region of the p-n junction recombine to produce photons. However, the light emitted along th p-n junction under the contact is absorbed by the contact, which in effect acts as a shadow to a portion of the light being emitted from the entire p-n junction, thus reducing the total external light output. Therefore, in order to increase the output of the light being emitted along the entire p-n junction of the diode it is essential to minimize contact shadowing beneath the contact area.

SUMMARY OF THE INVENTION

In accordance with the illustrated preferred embodiment, the present invention diffuses a metal in a heterojunction region beneath a metal contact of an AlGaAs light emitting diode. Specifically, the invention takes a double heterojunction light emitting diode, which can be fabricated by any conventional processing method, and subjects it to a diffusion of zinc metal in the selected region. In the preferred embodiment, a contact made of metal, e.g., aluminum, is subsequently attached to the diode. The diffused zinc penetrates through the p-active layer of a first heterojunction region and extends into a portion of an n-region of a second heterojunction region. The zinc impurities in this portion of the n-region converts it to p-type and creates a p-n junction with a higher threshold voltage in this diffused region than those in the grown-in, nondiffused region. As current is applied to the diode via an external contact, the diffused region impedes the flow of current, consequently, the junction current beneath the contact region is shifted to outside the diffused region. The light emitting area is now concentrated at the periphery of the diffused region. Light output is then increased, because the light is no longer absorbed by the contact as before. This process, in short, reduces the contact shadowing problem due to current crowding beneath the contact of the prior art to increase the light output of a device by a factor of 2 to 5.

DETAILED DESCRIPTION OF THE INVENTION

Figure 1:
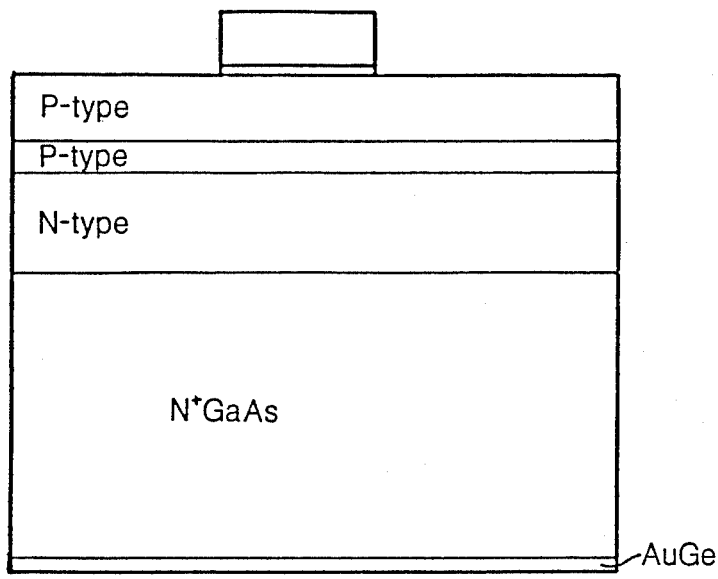
FIG. 1 shows a cross-sectional view of a double heterojunction AlGaAs light emitting diode in accordance with the prior art.
Figure 2:
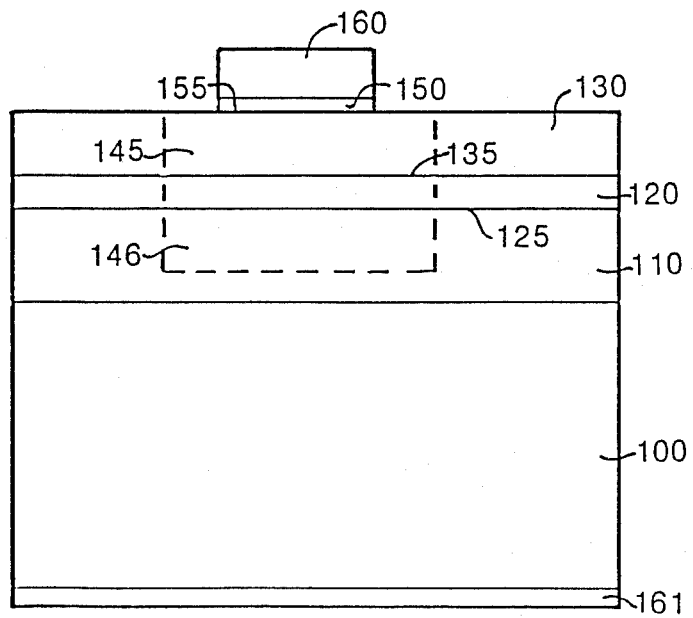
FIG. 2 shows a cross-sectional view of a double heterojunction AlGaAs light emitting diode in accordance with the present invention.

As illustrated in FIG. 2, an n-type aluminum gallium arsenide (AlGaAs) layer 10 having a thickness typically in the range of 5 to 20 microns is formed on an n-type AlGaAs substrate 100 by conventional techniques, such as by expitaxial growth. A p-active layer 120 is formed over the n-type AlGaAs layer 110, also by epitaxial growth methods. The p-active layer 120 is typically made of p-type AlGaAs having a thickness typically in the range of 0.5 to 2 microns. A first heterojunction 125 is thereby formed by the n-type GaAs layer 110 and the p-active layer 120.

A p-type AlGaAs layer 130 having a thickness typically in the range of 1 to 10 microns is formed over the p-active layer 120 by conventional techniques, such as by epitaxial growth. A second heterojunction 135 is thereby formed by the p-active layer 120 and the p-type AlGaAs layer 130.

A metal, for example, zinc, is diffused in a region 145 which incorporates the heterojunctions 125 and 135. The diffused zinc extends into and terminates at a portion 146 of the n-type AlGaAs layer 110 beneath the first heterojunction 125. Other materials such as cadium can also be used for the diffusion metal. In the present invention, the zinc impurities in the diffused region 145 act as acceptors of electrons and counterdopes the portion 146 of the n-type AlGaAs layer 110 beneath the first heterojunction 125 to make it p-type. The diffused region 145, which is now totally p-type, in effect redirects the current flowing through the device by impeding the flow of current through the diffused region. The junction current is redirected from beneath the contact to outside the diffused region.

A pre-contact layer 150, typically made of GaAs, is formed over a contact region 155 in the diffused region 145. A contact 160 is then formed over the pre-contact 150 in the contact region 155 by conventional techniques, such as evaporation or sputtering. The contact 160 is typically made of aluminum. A contact layer 161 is then formed over the remaining surface of the GaAs 100 by conventional methods. The contact layer 161 is typically made of gold-germanium alloy. As current is applied via contacts 160 and 160, the p-n junction regions outside the diffused region turn on before those in the diffused region because of the higher threshold voltage to the p-n junctions in the diffused region; this redirects the flow of current under the contact where the diffused region is, thereby reducing the contact shadowing due to current crowding and increasing light output at the periphery of the diffused region.

An increase on the measurable light output generated from the first heterojunction 125 (illustrated in FIG. 2) at the periphery of the diffused region is realized with the illustrated embodiment; light output on the order of 2.6 lumens/ampere at 2 milliamps of current without device encapsulation is common.

I claim:

1. A method of impeding light generation in a region of an active layer of semiconductor material between and defining heterojunctions with base and window layers with band gaps wider than the band gap of said active layer, said window layer being of the same conductivity type as said active layer, said base layer being of the conductivity type opposite to that of said active layer, said method comprising the step of:

diffusing a dopant of the same conductivity type as said active layer through said region and into said base layer so that when light is generated in said active layer, light generation is impeded in the intersection of said dopant region and said active region.

2. The method of claim 1 wherein said dopant is a metal.

3. A method of manufacturing a light emitting diode comprising the steps of:

obtaining a substrate;

forming on said substrate a base layer having a predetermined conductivity type and band gap;

forming on said base layer an active layer having a conductivity type opposite that of said base layer and a band gap narrower than that of said base layer so as to define a first heterojunction;

forming on said active layer a window layer having a band gap wider than that of said active layer so as to define a second heterojunction; and introducing a dopant of the same conductivity type as that of said active layer in a dopant region extending generally orthogonally through adjacent portions of said window and active layers and at least partially through an adjacent portion of said base layer so that when light is generated in said active layer, light generation is impeded in the intersection of said dopant region and said active region.

4. The method of claim 3 wherein said dopant is introduced by diffusion.

5. The method of claim 3 wherein said dopant is zinc.

6. The method of claim 3 further comprising the step of forming a metal contact adjacent to the common volume of said window layer and said dopant region.

7. The method of claim 3 further comprising the step of applying light-absorbing material adjacent to the common volume of said window layer and said dopant region.

8. A method of impeding light generation in a region of an active layer of semiconductor material between and defining heterojunction with first and second layers with band gaps wider than the band gap of said active layer, said first layer being of AlGaAs and said second layer being of AlGaAS, said second layer being of the same conductivity type as said active layer, said first layer being of the conductivity type opposite to that of said active layer, said method comprising the step of:

diffusing a dopant of the same conductivity type as said active layer through said region and into first layer so that, when light is generated in said active layer, light generation is impeded within said region.

9. A method of manufacturing a light emiting diode comprising the steps of:

obtaining a substrate;

forming on said substrate a first layer of AlGaAs having a predetermined conductivity type and band gap;

forming on said base layer an active layer of AlGaAs having a conductivity type opposite that of said first layer and a band gap narrower than that of said first layer so as to define a first heterojunction;

forming on said active layer a second layer of AlGaAs having a band gap wider than that of said active layer so as to define a second heterojunction; and introducing a dopant of the same conductivity type as that of said active layer in a dopant region extending generally orthogonally through adjacent portions of said second and active layers and at least partially through an adjacent portion of said first layer so that, when light is generated in said active layer, light generation is impeded in the intersection of said dopant region and said active region.

* * * * *